United States Patent [19]
Inushima et al.

[11] Patent Number: 6,013,338
[45] Date of Patent: *Jan. 11, 2000

[54] CVD APPARATUS

[75] Inventors: Takashi Inushima; Shigenori Hayashi; Toru Takayama, all of Kanagawa; Masakazu Odaka, Akita; Naoki Hirose, Yamaguchi, all of Japan

[73] Assignee: Semiconductor Energy Laboratory Co., Ltd., Kanagawa, Japan

[*] Notice: This patent is subject to a terminal disclaimer.

[21] Appl. No.: 09/188,382

[22] Filed: Nov. 10, 1998

Related U.S. Application Data

[62] Division of application No. 08/769,115, Dec. 18, 1996, Pat. No. 5,855,970, which is a division of application No. 08/376,736, Jan. 23, 1995, Pat. No. 5,629,245, which is a division of application No. 07/971,242, Sep. 8, 1992, Pat. No. 5,427,824, which is a continuation-in-part of application No. 07/497,794, Mar. 22, 1990, abandoned, which is a continuation of application No. 07/091,770, Sep. 1, 1987, abandoned.

[30] Foreign Application Priority Data

| Sep. 9, 1986 | [JP] | Japan | .................................. 61-213323 |
| Sep. 9, 1986 | [JP] | Japan | .................................. 61-213324 |
| Sep. 9, 1986 | [JP] | Japan | .................................. 61-213325 |
| May 6, 1987 | [JP] | Japan | .................................. 62-141050 |

[51] Int. Cl.[7] .................................................... H05H 1/24
[52] U.S. Cl. .................. 427/579; 427/58; 427/255.3; 427/255.7; 427/331; 427/344; 427/574; 427/581
[58] Field of Search .................................. 427/574, 579, 427/583, 581, 255.3, 255.7, 419.3, 331, 58, 344, 534

[56] References Cited

U.S. PATENT DOCUMENTS

| 3,026,435 | 3/1962 | McPherson | .............................. 313/22 |
| 3,228,812 | 1/1966 | Blake | .................................... 427/93 X |
| 3,372,672 | 3/1968 | Wright | .................................. 427/54.1 |
| 3,485,666 | 12/1969 | Sterling et al. | ............................ 427/37 |
| 3,619,682 | 11/1971 | Lo | ............................................. 313/22 |

(List continued on next page.)

FOREIGN PATENT DOCUMENTS

| 51-21753 | 7/1976 | Japan . |
| 52-065575 | 5/1977 | Japan . |
| 59-104120 | of 1984 | Japan . |
| 59-087834 | 5/1984 | Japan . |
| 59-82732 | 5/1984 | Japan . |

(List continued on next page.)

OTHER PUBLICATIONS

"Nikkei Microdevices", No. 26, Aug. 1987, pp. 125–133 (Full Translation).

van der Van, "Plasma Deposition of Silicon Dioxide and Silicon Nitride Films", Solid State Technology, No. 23, No. 11, Apr. 1981, pp. 167–171.

Pande et al., "A Novel Low-Temperature Method of $Si_2$ Film Deposition for MOSFET Applications", Journal of Electronic Materials, CVol. 13, No. 3, 1984, pp. 593–602. (No month avail.).

(List continued on next page.)

*Primary Examiner*—Bernard Pianalto
*Attorney, Agent, or Firm*—Sixbey, Friedman, Leedom & Ferguson, P.C.; Gerald J. Ferguson, Jr.; Jeffrey L. Costellia

[57] ABSTRACT

An improved CVD apparatus for depositing a uniform film is shown. The apparatus comprises a reaction chamber, a substrate holder and a plurality of light sources for photo CVD or a pair of electrodes for plasma CVD. The substrate holder is a cylindrical cart which is encircled by the light sources, and which is rotated around its axis by a driving device. With this configuration, the substrates mounted on the cart and the surroundings can be energized by light of plasma evenly throughout the surfaces to be coated.

52 Claims, 8 Drawing Sheets

U.S. PATENT DOCUMENTS

| | | | |
|---|---|---|---|
| 3,661,637 | 5/1972 | Sirtl | 427/54.1 |
| 3,665,235 | 5/1972 | Hugot | 313/24 |
| 3,934,060 | 1/1976 | Burt et al. | 427/95 |
| 4,137,365 | 1/1979 | Wydeven et al. | 428/412 |
| 4,282,268 | 8/1981 | Priestley et al. | 427/579 |
| 4,323,810 | 4/1982 | Horstmann | 313/24 |
| 4,330,570 | 5/1982 | Giuliani et al. | 427/64 |
| 4,365,107 | 12/1982 | Yamauchi | 427/39 |
| 4,371,587 | 2/1983 | Peters | 428/446 |
| 4,402,997 | 9/1983 | Hogan et al. | 118/71.5 |
| 4,419,385 | 12/1983 | Peters | 427/99 |
| 4,435,445 | 3/1984 | Allred et al. | 427/54.1 |
| 4,435,476 | 3/1984 | Phillips et al. | 428/412 |
| 4,451,503 | 5/1984 | Blum et al. | 427/53.1 |
| 4,496,609 | 1/1985 | McNeilly | 427/55 |
| 4,496,828 | 1/1985 | Kusmierz | 118/730 |
| 4,503,126 | 3/1985 | Phillips et al. | 428/412 |
| 4,509,451 | 4/1985 | Collins et al. | 427/39 |
| 4,529,474 | 7/1985 | Fujiyama et al. | 134/1 X |
| 4,529,475 | 7/1985 | Okano et al. | 156/643 |
| 4,532,022 | 7/1985 | Takashi et al. | |
| 4,532,196 | 7/1985 | Yasui et al. | |
| 4,539,068 | 9/1985 | Takugi et al. | 427/39 |
| 4,544,423 | 10/1985 | Tsuge et al. | 427/74 |
| 4,558,660 | 12/1985 | Nishizawa | 118/715 |
| 4,567,352 | 1/1986 | Mimura et al. | 219/405 |
| 4,568,565 | 2/1986 | Gupta et al. | 427/255.2 |
| 4,576,698 | 3/1986 | Gallagher et al. | 134/1 X |
| 4,581,100 | 4/1986 | Hatzakis et al. | 156/643 |
| 4,601,781 | 7/1986 | Mercier et al. | 156/643 |
| 4,608,117 | 8/1986 | Ehrlich et al. | 427/53.1 |
| 4,612,207 | 9/1986 | Jansen | 118/723 |
| 4,615,294 | 10/1986 | Scapple | 118/725 |
| 4,633,809 | 1/1987 | Hirose | 118/719 |
| 4,649,071 | 3/1987 | Tajima et al. | 428/212 |
| 4,654,226 | 3/1987 | Jackson et al. | 427/54.1 |
| 4,676,195 | 6/1987 | Yasui | 118/723 |
| 4,681,653 | 7/1987 | Purdes et al. | 427/39 |
| 4,695,331 | 9/1987 | Romaprasud | 427/54.1 |
| 4,699,805 | 10/1987 | Seelbach et al. | 118/71.5 |
| 4,702,934 | 10/1987 | Ishihara et al. | 427/39 |
| 4,702,936 | 10/1987 | Maeda et al. | 427/54.1 |
| 4,709,655 | 12/1987 | Van Mastright | 118/723 |
| 4,713,258 | 12/1987 | Umemura | 427/35 |
| 4,717,596 | 1/1988 | Barber et al. | 427/248.1 |
| 4,719,123 | 1/1988 | Haku et al. | 427/53.1 |
| 4,726,963 | 2/1988 | Ishihara et al. | 427/53.1 |
| 4,728,528 | 3/1988 | Ishihara et al. | 427/53.1 |
| 4,753,818 | 6/1988 | Rogers, Jr. | 427/54.1 |
| 4,759,947 | 7/1988 | Ishihara et al. | 427/53.1 |
| 4,786,352 | 11/1988 | Benzing | 156/643 |
| 4,795,880 | 1/1989 | Hayes et al. | 219/121.52 |
| 4,811,684 | 3/1989 | Tashiro et al. | 427/53.1 |
| 4,872,947 | 10/1989 | Wang et al. | 216/38 |
| 4,892,753 | 1/1990 | Wang et al. | 427/579 |
| 4,950,624 | 8/1990 | Inuzima et al. | 437/235 |
| 5,000,113 | 3/1991 | Wang et al. | 118/723 |
| 5,354,715 | 10/1994 | Wang et al. | 438/699 |
| 5,362,526 | 11/1994 | Wang et al. | 427/573 |
| 5,424,131 | 6/1995 | Wertheimer et al. | 428/413 |
| 5,427,824 | 6/1995 | Inushima et al. | 427/493 |
| 5,607,880 | 3/1997 | Suzuki et al. | 437/195 |
| 5,629,245 | 5/1997 | Inushima et al. | 216/13 |

FOREIGN PATENT DOCUMENTS

| | | | |
|---|---|---|---|
| 59-181648 | 10/1984 | Japan . | |
| 59-194452 | 11/1984 | Japan . | |
| 60-245217 | 5/1985 | Japan . | |
| 60-167318 | 8/1985 | Japan . | |
| 61-063020 | of 1986 | Japan . | |
| 61-103539 | of 1986 | Japan . | |
| 61-063020 | 4/1986 | Japan . | |
| 61-65419 | 4/1986 | Japan | 118/725 |
| 61-210622 | 9/1986 | Japan | 118/725 |
| 61-228633 | 10/1986 | Japan . | |
| 61-234531 | 10/1986 | Japan . | |
| 62-054940 | 3/1987 | Japan . | |
| 62-51243 | 3/1987 | Japan . | |
| 62-80272 | 4/1987 | Japan | 118/725 |
| 62-160462 | 7/1987 | Japan | 118/725 |
| 62-188375 | 8/1987 | Japan . | |
| 63-147314 | of 1988 | Japan . | |
| 63-147314 | 6/1988 | Japan . | |
| 63-246829 | 10/1988 | Japan . | |
| 64-28925 | 1/1989 | Japan . | |
| 2-219232 | 8/1990 | Japan . | |
| 182797 | 9/1966 | U.S.S.R. | 313/22 |

OTHER PUBLICATIONS

Wang et al., "Fast Deposition of a Leveled $SiO_2$ Even on Al Wirings Having 0.6μm Gaps", Nikkei Microdevices, vol. 8, No. 26, Aug. 1987, pp. 125–133.

Nikkei Microdevices, No. 25, Jul. 1987, pp. 132–137.

Levin et al., "The Step Coverage of Undoped and Phosphorus–Doped $SiO_2$ Glass Films", J. Van. Sci. Technol. B., vol. 1, No. 1, Jan.–Mar. 1983, pp. 54–61.

Amick, "Deposition techniques for Dielectric Films on Semiconductor Devices", J. Vac. Sci. Technol., vol. 14, No. 5, Sep./Oct. 1977, pp. 1053–1063.

Priestley et al., "Deposition and Characterization of Thin $SiO_x$ Films", Thin Solid Films, vol. 69, 1980, pp. 39–43 (No month avail.).

Okabayashi, "Surface Planarization Technique in Integrated Circuits", Ohyo Butsuri, vol. 7, No. 54, 1985, pp. 39–43 (No month avail.).

Kamisako et al., "Analysis of Deposition Rate Distribution in the Photo–CVD of a–Si by a Unified Reactor with a Lamp", Japanese Journal of Applied Physics, vol. 23, No. 10, Oct. 1984, pp. L776–L778.

Wolf, "Silicon Processing for the VLSI ERA—vol. 2: Process Integration", Lattice Press, Sunset beach, California, 1990 (No month avail.).

Suzuki et al., "Planarized Deposition of High–Quality Silicon Dioxide Film by Photo Assisted Plasma CVD at 300 °C using Tetractryl Orthosilicate", Japanese Journal of Applied Physics, Part 2, vol. 29, No. 12, 1990, pp. 2341–2344 (No month avail.).

Inanov et al., "Modeling of the Plasmochemical Synthesis of Silicon Dioxide", 1985 (No month avail.).

"Properties of Silicon Dioxide Films Prepared from Tetralhoxysilane from Gas and Liquid Phases".

Ghandi, "VLSI Fabrication Principles", Published by John Wiley & Sons, New York, 1983, pp. 422–424 (No month avail.).

Wang et al., "The Key is Decomposition of TEOS at Low Temperature by Using Ozone"(in Japanese with Partial English Translation) No date available.

Wolf, "Si. Proc. for the VLSI ERA", vol. 1 (1986), pp. 182–187 (No month avail.).

"Planar Tech. for Sub. Micron Device . . . Complex Proc" Semiconductor News, 1989 (No month avail.).

CVD APPARATUS

This application is a Divisional of application Ser. No. 08/769,115, filed Dec. 18, 1996, U.S. Pat. No. 5,855,970, which is itself a Divisional of application Ser. No. 08/376,736, filed Jan. 23, 1995, now U.S. Pat. No. 5,629,245, which is itself a Divisional of application Ser. No. 07/971,242, filed Sep. 8, 1992, now U.S. Pat. No. 5,427,824, which is a Continuation-in-Part of application Ser. No. 07/497,794 filed Mar. 22, 1990; which in turn is a Continuation of application Ser. No. 07/091,770, both filed Sep. 1, 1987 now abandoned.

BACKGROUND OF THE INVENTION

The invention relates to a photo enhanced CVD apparatus.

Many chemical vapor deposition (CVD) processes are used, such as APCVD, LP CVD, plasma CVD, thermal CVD and so forth, for depositing a film on a substrate. WHile these processes have their own peculiar characteristics respectively, the temperature at which each process is carried out is commonly rather high. Such high temperature process is not suitable for formation of passivation film on an aluminum electrode arrangement.

Photo enhanced CVD process has attracted the interest of artisans because it can be carried out at a comparatively low temperature. This process is based on the energy of light, namely an optical reaction is carried out. For example, in the case of photo CVD process using silane and ammonia, mercury atoms are excited by irradiation of ultraviolet light of 2,537 Å in wavelength. The process is carried out to deposit a silicon nitride film on a substrate in accordance with the following equation:

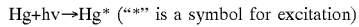

Hg+hv→Hg* ("*" is a symbol for excitation)

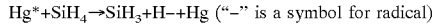

Hg*+SiH₄→SiH₃+H-+Hg ("-" is a symbol for radical)

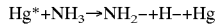

Hg*+NH₃→NH₂-+H-+Hg

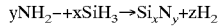

yNH₂-+xSiH₃→Si$_x$N$_y$+zH₂

In the above equations, x, y and z are chosen appropriately.

FIG. 1 is a cross-section view showing a photo CVD apparatus which has been devised by the inventors in advance of the present invention. To facilitate the understanding of the background of the present invention, this apparatus will be briefly explained. In the figure, the apparatus comprises a reaction chamber 31, light source chambers 39 and ultraviolet light sources 41. Between the light source chambers 39, a cart 35 is mounted so as to be capable of moving in the direction perpendicular to the drawing sheet. The cart is provided with heaters 37 to heat substrates mounted on the external surfaces of the cart 35 facing to the light source chambers 39. The temperature of the substrates 33 is elevated to about 200° C. which is suitable for forming a silicon nitride film. In the reaction chamber 31 is circulated a process gas at a pressure of several Torrs. The process gas is irradiated through quartz windows 47 with light radiated from the light source 41. A numeral 45 designates electrodes by virtue of which discharge takes place with the cart as the other electrode and undesired product deposited on the surface of the quartz windows 47 can be eliminated by sputtering.

However, with this apparatus, the thickness of deposited film depends on the spatial relationship between the light sources and the position of the substrates. Namely, the product of the CVD process may be deposited with a greater thickness at the position irradiated with stronger light. Generally speaking, the tolerable fluctuation of the thickness of the film is about 10%. Furthermore, the quartz windows 47 have to be thick to bear the differential pressure between the inside of the reaction chamber 31 and the light source chamber 39 in which cooling gas is circulated. The differential pressure may cause leakage of the cooling gas from the light source chamber 39 into the reaction chamber 31. As an alternative, a particular cooling system may be provided for the light source chamber so the pressure in the light source chamber, and therefore the differential pressure, can be decreased. Also, when discharge between the cart 35 and the reaction chamber 31 is desired to remove unnecessary film deposited on the light window by sputtering, the discharge tends to deviate from the window. Because of this, the particular electrodes 45 have to be provided which makes the size of the apparatus large.

As to unevenness of film deposited by CVD, it is also the problem in the case of plasma CVD. The energy of plasma seems dependent on the relationship between the substrate and a pair of electrodes for discharge. So a uniform deposition condition on a substrate to be coated is also demanded for plasma CVD.

SUMMARY OF THE INVENTION

It is therefore an object of the invention to provide an CVD apparatus with which a film can be deposited with a uniform thickness.

It is another object of the invention to provide a CVD apparatus with which a film can be deposited with high quality.

It is a further object of the invention to provide a cheaper CVD apparatus.

It is still a further object of the invention to provide a compact CVD apparatus.

DETAILED DESCRIPTION OF THE PREFERRED EMBODIMENT

Figure 1:
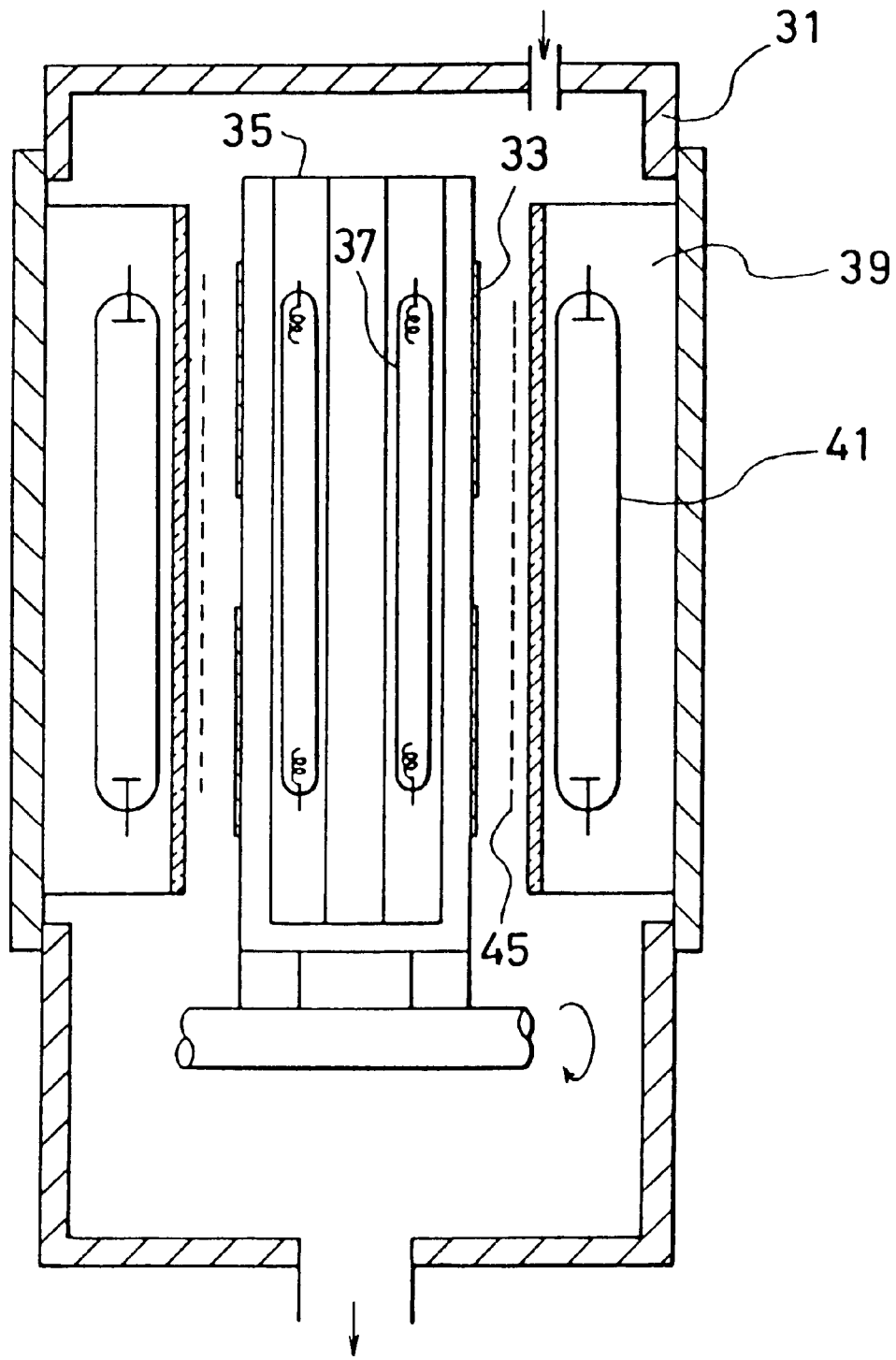
FIG. 1 is a cross-section view of an example of a photo CVD apparatus.
Figure 2:
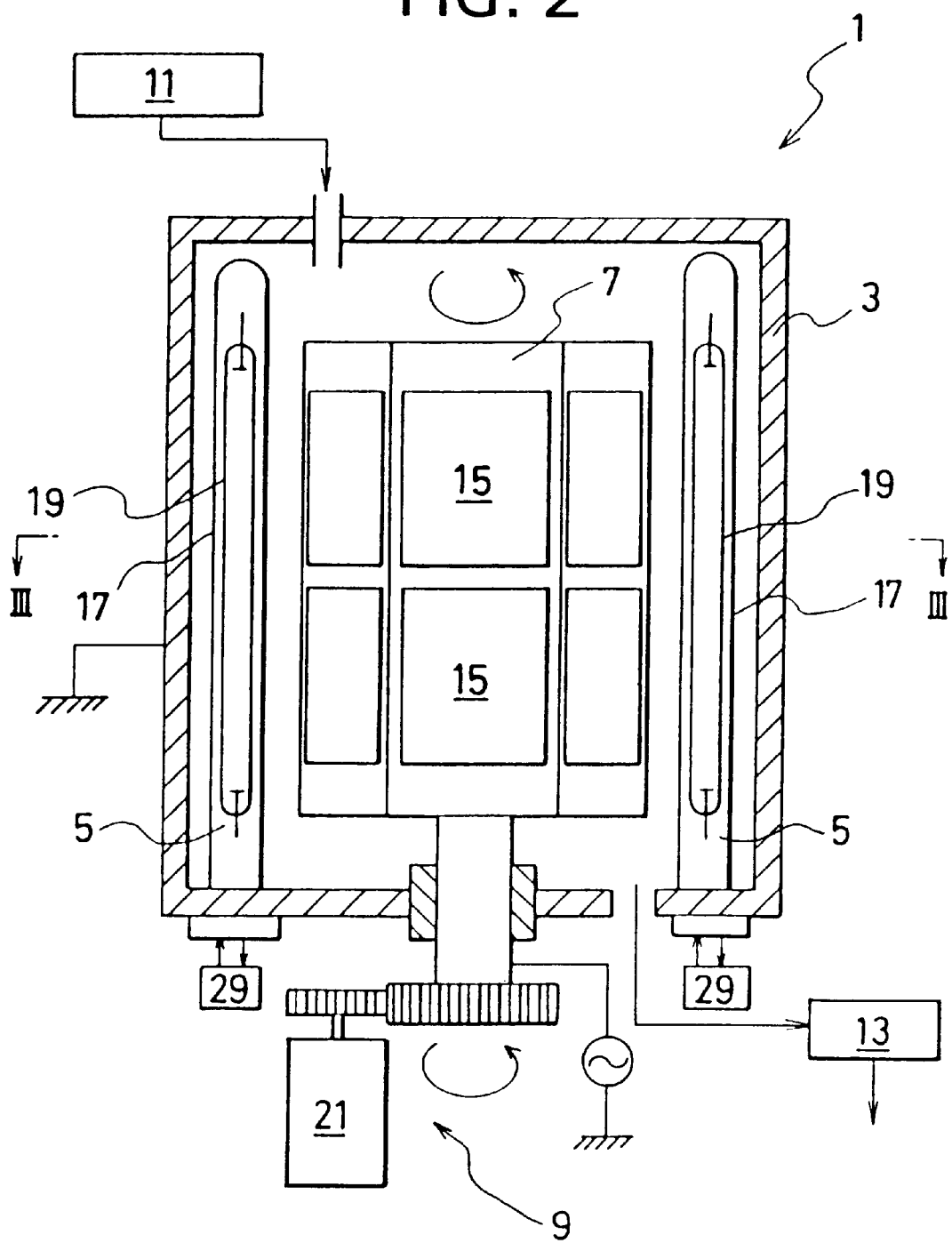
FIG. 2 is a cross-section view showing an embodiment of the invention.
Figure 3:
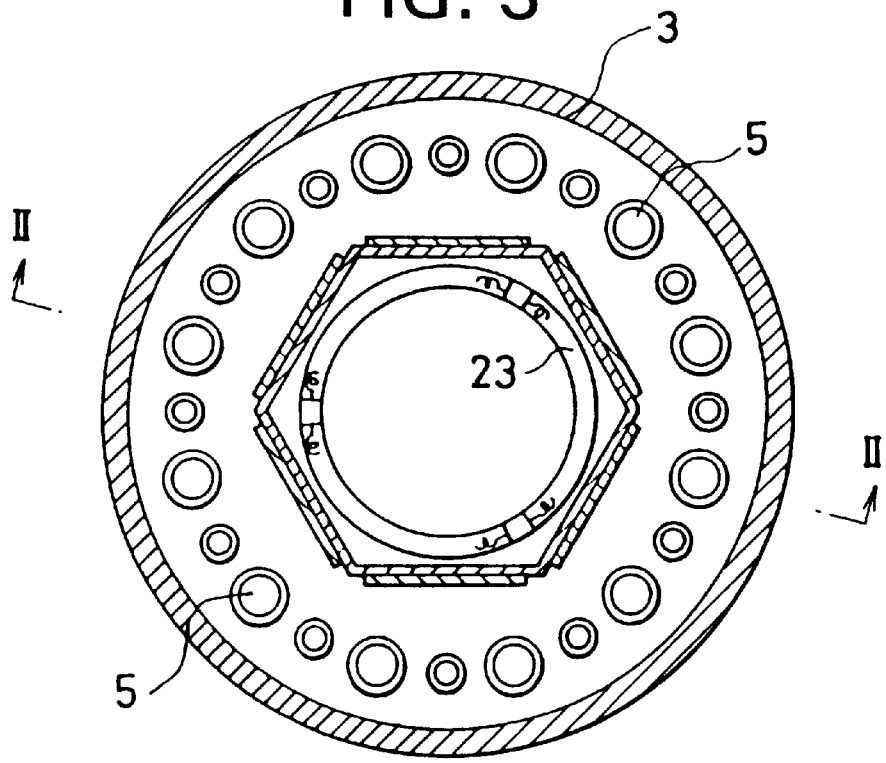
FIG. 3 is a cross-section view taken along a III—III line of FIG. 2.

Referring to FIG. 2 and FIG. 3, a photo enhanced CVD apparatus in accordance with the invention is illustrated. In the figure, the apparatus 1 comprises a reaction chamber 3, a hexagonal cart as a substrate holder having six lateral faces on which substrates 15 are mounted, a driving device 9 with a motor 21 for rotating the cart 7 around its axis, a plurality of quartz tubes 17, which may be alternatingly provided of different diameters, on the inside of the reaction chamber 3, with one end of each tube at a constant angular distance around the cart 7 and with the other end of each tube being closed, mercury lamps 19 provided in and housed air-tightly by the quartz tube respectively, halogen lamp heaters 23 arranged along the axial direction, a process gas introduction system 11, and an exhaustion system 13. A cooling gas, such as nitrogen gas, is circulated in the quartz tubes 17 by means of recirculation means 29. On each face of the cart 7, two substrates each 35 cm long and 30 cm wide can be mounted, and therefore the cart 7 can hold twelve substrates thereon. The cart is preferentially removable from the driving device so that substrates can be mounted outside the reaction chamber 3.

Next, the process in the apparatus will be explained. First, twelve substrates are mounted on the cart 7 and entered into the reaction chamber 3. After evacuating the reaction chamber 3 to $10^{-2}$–$10^{-6}$ Torr by means of the exhaustion system 13, a process gas is inputted from the introduction system 11 at about 3 Torr. Simultaneously, the substrates 15 are heated by the heater 23 to about 200° C. Then, the cart 7 encircled by the mercury lamps 19 is rotated at 2 rpm by the driving device 9 and irradiated with ultraviolet light from the lamps 19, whereupon the product of a reaction initiated by optical energy is deposited on the substrates 15. The product undesirably deposited on the quartz tubes 17 can be removed by sputtering in virtue of discharge between the cart 7 and the reaction chamber 3. Photo enhanced CVD process is carried out, e.g., in accordance with the following equation:

$$3Si_2H_6 + 8NH_3 \rightarrow 2Si_3N_4 + 21H_2 \text{ or}$$

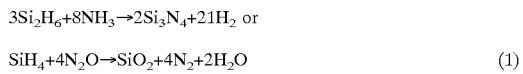

(1)

Figure 4:
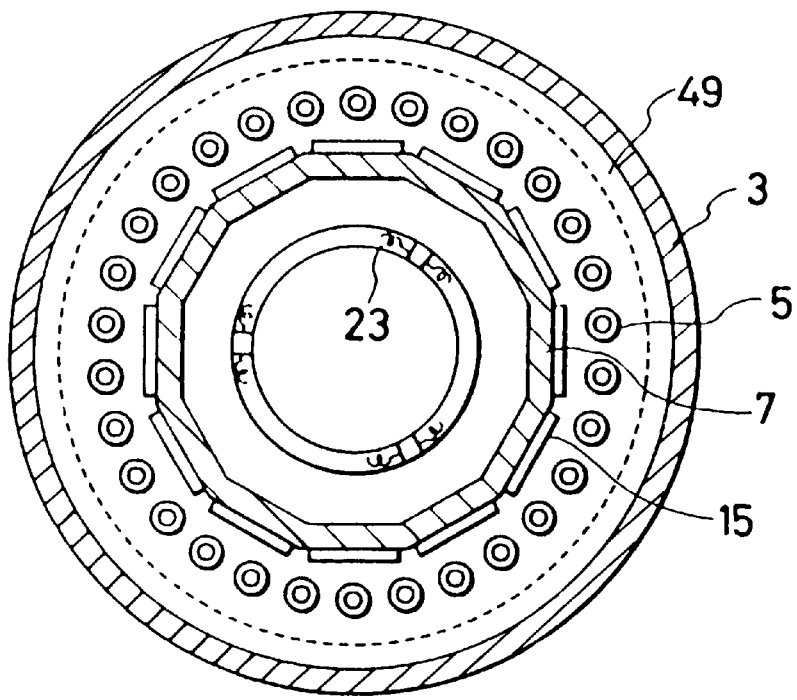
FIG. 4 is a cross-section view showing another embodiment of the invention.

Referring now to FIG. 4, another embodiment of the invention is illustrated. This embodiment is same as the preceding embodiment except for the number of side faces of a cart and provision of an electrode 49 in the form of a cylindrical wire net disposed between the cart 7 and the reaction chamber 3. The cart has twelve side faces each capable of holding two substrates. The electrode 49 is used both for generating plasma gas by discharging between itself and the cart 7, and for carrying our etching eliminating unnecessary product deposited on the inside wall of the reaction chamber 3, the external surfaces of the light sources 5 and so forth. The electrode 49 can be placed between the light sources 5 and the cart 7 instead. Plasma CVD may be implemented simultaneously by causing discharge during photo CVD process, or may be implemented after deposition by photo CVD. Plasma CVD is carried out, e.g., using TEOS (tetra-ethyl-oxy-silane) in accordance with the following equations:

$$SiO_4(C_2H_5)_4 + 14O_2 \rightarrow SiO_2 + 8CO_2 + 10H_2O, \text{ or}$$

$$SiO_4(C_2H_5)_4 + 28N_2O \rightarrow SiO_2 + 8CO_2 + 10H_2O + 28N_2 \qquad (2)$$

After taking out, from the reaction chamber, the substrates on which the deposition has been deposited, undesirable deposited product is removed from the inside of the reaction chamber by means of etching in virtue of discharge between the cart 7 and the electrode 49. The etching is carried out, e.g., in accordance with the following equations:

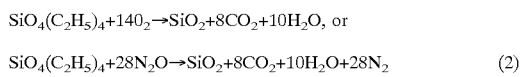

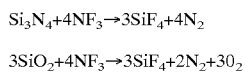

Figure 5A:
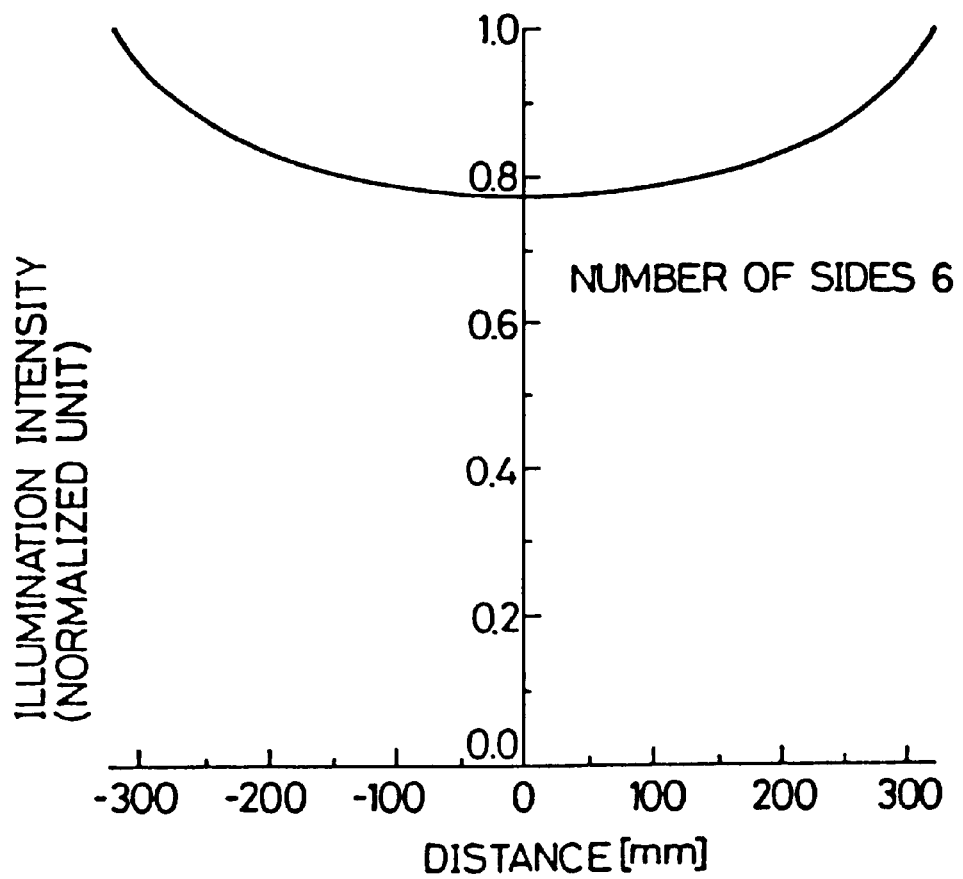
FIGS. 5(A) to 5(C) are graphical diagrams showing the distributions of the intensity on substrates mounted on prism-shaped substrate holder having cross-sections of regular polygons of 6, 12, and 24 sides.
Figure 5B:
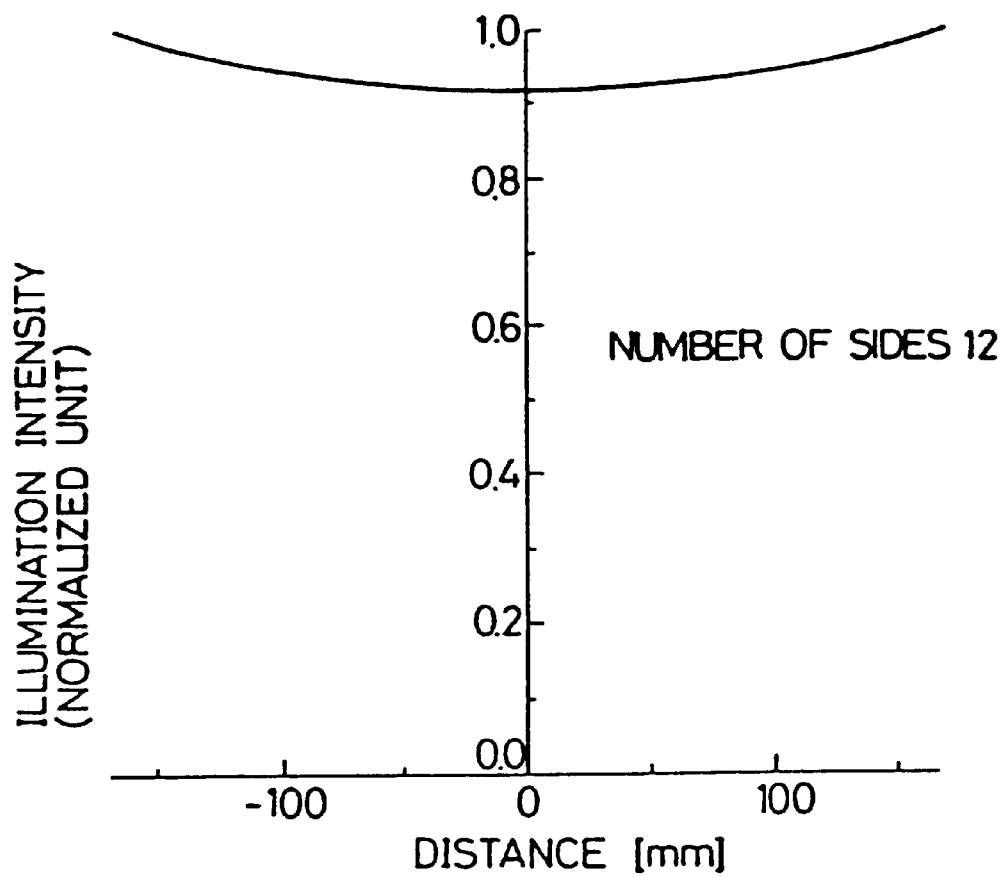
Figure 5C:
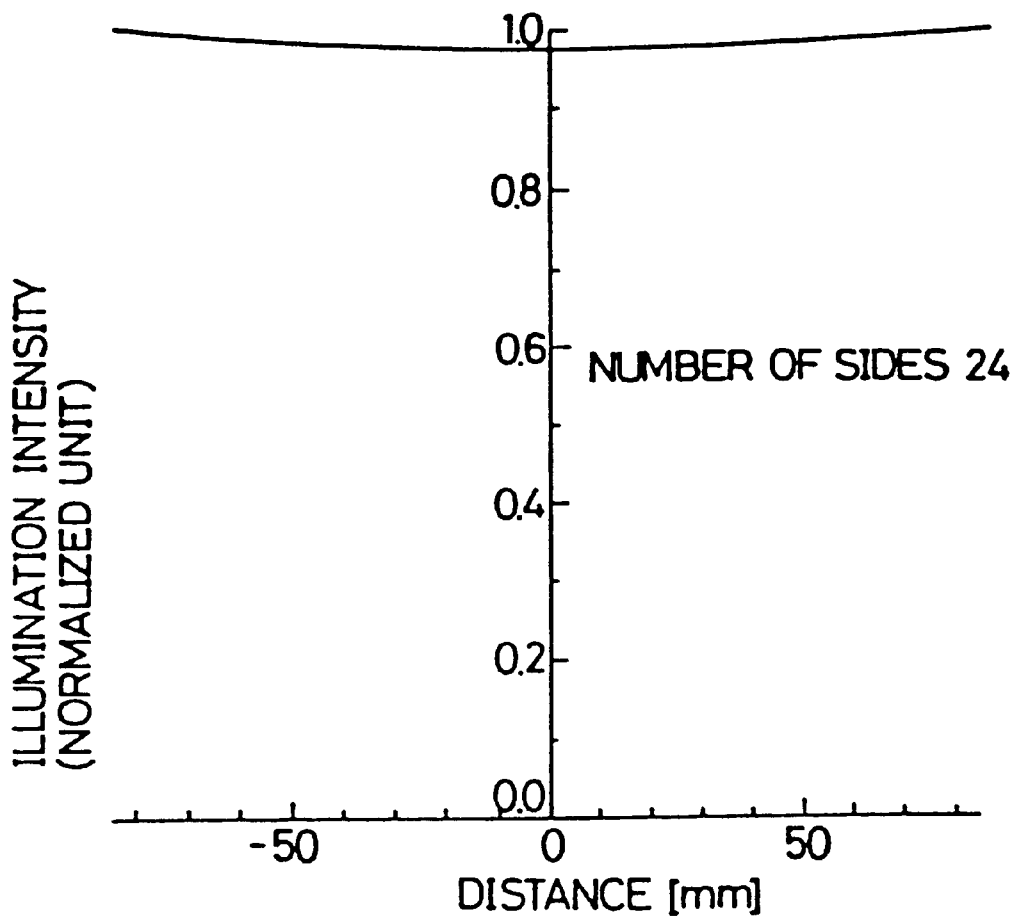

To investigate the relationship between the uniformity of the illumination intensity on the substrate and the number of side faces of the cart, experimental data has been gathered. FIGS. 5(A) to 5(C) are graphical diagrams showing the distributions of the intensity on substrates mounted on prism-shaped substrate holders having cross-sections of regular polygons of 6, 12 and 24 sides. In the figure, the abscissa is the distance of the measuring point from the center of a substrate, and the ordinate is the intensity normalized with reference to the maximum intensity measured on the substrate. As shown from the diagrams, the distribution of the intensity becomes more uniform as the number of the faces increases. Namely, the intensity fluctuates over the irradiated surface at larger than 10% in the case of the cart having six faces, while the fluctuation of the intensity is limited within 5% in the cases of the carts having twelve and twenty-four faces. The cart having twenty-four faces may hold forty-eight substrate by mounting two substrates on each face.

Figure 6A:
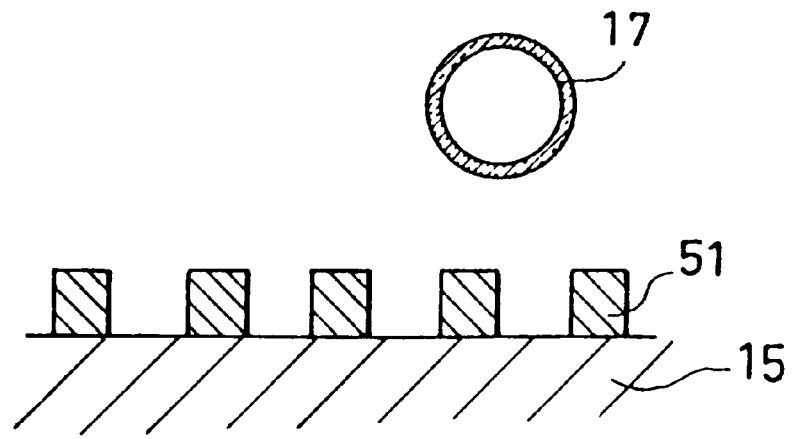
FIGS. 6(A) to 6(C) and FIG. 7 are section views showing the process of an example of CVD in accordance with this invention.
Figure 6B:
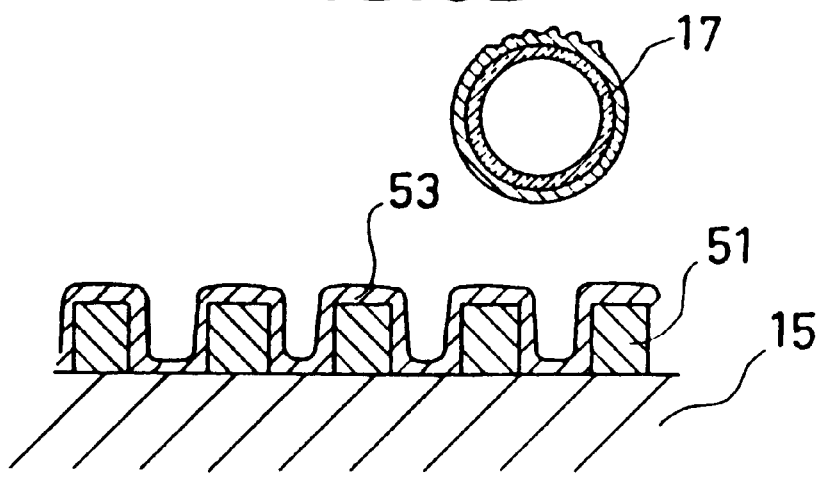
Figure 6C:
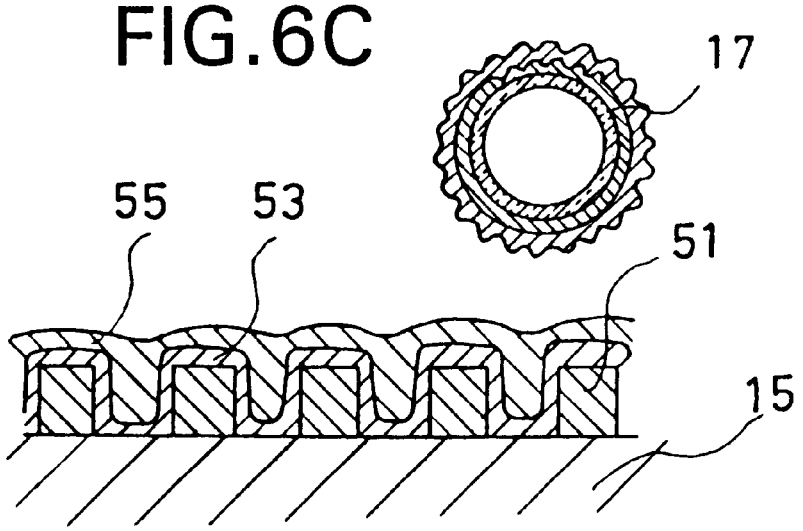

FIGS. 6(A) to 6(C) are cross-section views showing an example of CVD process in accordance with the present invention. The surface of a substrate to be coated is provided with a plurality of aluminum lead lines 51. The leads 51 are elongated in the direction perpendicular to the drawing sheet with 0.8 micron in height, 0.6 micron in width and 0.9 micron in interval as shown in FIG. 6(A). A silicon oxide film is deposited on the substrate over the leads 51 by photo CVD in accordance with the equation (1) to the thickness of 0.3 to 0.5 at about 400° C. as shown in FIG. 6(B). Further, another silicon oxide film 55 is deposited by plasma CVD in accordance with the equation (2) at 200° C. as shown in FIG. 6(C).

Figure 7:
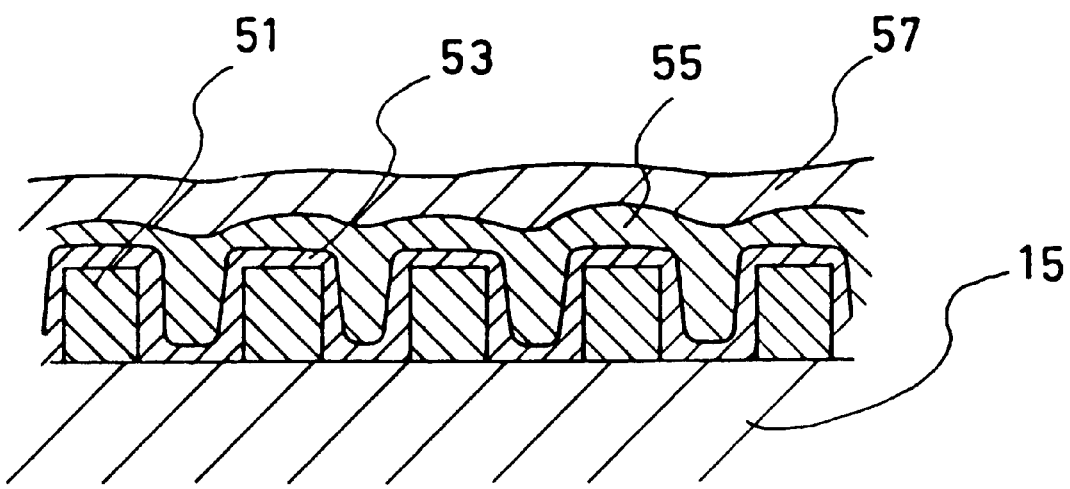

The use of TEOS is advantageous particularly for forming a film on an uneven surface, specifically, it is possible to form a substantially even or uniform film, even on a side surface of or on a lower surface between the steps shown in FIG. 6(A) by reference numeral 51. It is presumed that this is because TEOS is in a liquid state at room temperature and has a relatively large viscosity even when it is gasified. The even upper surface is desirable when provided with an overlying aluminum electrode 57 as shown in FIG. 7. The likelihood of disconnection of electrode 57 is reduced by the even surface. After the completion of the deposition, the inside of the reaction chamber on the mercury lamp 19, only one being schematically shown in FIGS. 6(A) to 6(C). The etching process can be implemented on the deposited film before or after plasma CVD in order to obtain even surface of the film or to chamfer the edge of the film deposited.

By use of this process, film is deposited with a constant thickness throughout the surface of the substrate 15 in the light of the uniform irradiation over each substrate. However, the uniformity of the thickness can be further improved by modulating the intensity of the mercury lamps 19 in synchronization with the rotation of the cart 7, or by modulating the angular speed of the cart 7 in correspondence with the relative position to the mercury lamps 19. According to the gist of the invention, it is easily understood that the performance of non-photo enhanced plasma CVD is also improved by the use of the rotatable substrate holder.

The invention should not limited to the above particular embodiments and modifications and variations are possible as would be recognized by those skilled in the art. As the cross-section of the cart 7, other regular or irregular polygons, or circle can be employed. Also the driving device can be provided on the top side of the reaction chamber, or on the lateral side with pinion gear, in place of the bottom side as shown in FIG. 2.

What is claimed is:

1. A method for forming a device comprising the steps of:
   forming a first layer comprising a material selected from the group consisting of silicon oxide and silicon nitride on a surface by CVD using a first reactive gas containing a gas selected from the group consisting of $SiH_4$ and $Si_2H_6$;
   forming a second layer comprising silicon oxide on said first layer by plasma CVD using a second reactive gas comprising at least organic silane.

2. A method according to claim 1 further comprising a step of etching a surface of said second layer.

3. A method according to claim 1 wherein said organic silane is TEOS.

4. A method according to claim 1 wherein the CVD for forming the first layer is a photo CVD.

5. A method for forming a device comprising the steps of;
   forming a first layer comprising a material selected from the group consisting of silicon oxide and silicon nitride on a surface having a step by CVD using a first reactive gas containing a gas selected from the group consisting of $SiH_4$ and $Si_2H_6$; and
   forming a second layer comprising silicon oxide on said first layer by plasma CVD using a second reactive gas comprising at least organic silane.

6. A method according to claim 5 further comprising a step of etching a surface of said second layer.

7. A method according to claim 5 wherein said organic silane is TEOS.

8. A method according to claim 5 wherein the CVD for forming the first layer is a photo CVD.

9. A method for forming a device comprising the steps of:
   preparing a substrate having a plurality of conductive lines thereon;
   forming a first layer comprising a material selected from the group consisting of silicon oxide and silicon nitride over said plurality of wirings by CVD using a first reactive gas containing at least one of $SiH_4$ and $Si_2H_6$; and
   forming a second layer comprising silicon oxide on said first layer by plasma CVD using a second reactive gas containing at least organic silane; and
   forming an electrode on said second layer.

10. A method according to claim 9 further comprising a step of etching a surface of said second layer.

11. A method according to claim 9 wherein said organic silane is TEOS.

12. A method according to claim 9 wherein the CVD for forming the first layer is a photo CVD.

13. A method according to claim 9 wherein said second reactive gas further contains nitrogen oxide.

14. A method for forming a device comprising steps of:
   forming a first layer comprising silicon oxide on a surface by CVD using a first reactive gas containing a gas selected from the group consisting of $SiH_4$ and $Si_2H_6$;
   forming a second layer comprising silicon oxide on said first layer by plasma CVD using a second reactive gas comprising at least organic silane, and
   cleaning an inside of a reaction chamber in which said second layer has been formed.

15. A method of according to claim 14 wherein the cleaning step is carried out by using an etching gas comprising nitrogen fluoride.

16. A method of according to claim 14 wherein the cleaning of said inside of said reaction chamber is conducted by removing said second layer therefrom in accordance with a reaction, $3SiO_2+4NF_3 \rightarrow 3SiF_4+2N_2+3O_2$.

17. A method of according to claim 14 wherein said organic silane is TEOS.

18. A method of according to claim 14 wherein the CVD for forming the first layer is a photo CVD.

19. A method for forming a device comprising steps of:
   forming a first layer comprising silicon nitride on a surface by CVD using a first reactive gas containing a gas selected from the group consisting of $SiH_4$ and $Si_2H_6$;
   forming a second layer comprising silicon oxide on said first layer by plasma CVD using a second reactive gas comprising at least organic silane, and
   cleaning an inside of a reaction chamber in which said second layer has been formed.

20. A method of according to claim 19 wherein the cleaning step is carried out by using an etching gas comprising nitrogen fluoride.

21. A method of according to claim 19 wherein the cleaning of said inside of said reaction chamber is conducted by removing said second layer therefrom in accordance with a reaction, $3SiO_2+4NF_3 \rightarrow 3SiF_4+2N_2+3O_2$.

22. A method of according to claim 19 wherein said organic silane is TEOS.

23. A method of according to claim 19 wherein the CVD for forming the first layer is a photo CVD.

24. A method for forming a device comprising steps of:
   forming a first layer comprising silicon oxide on a surface by CVD using a first reactive gas containing a gas selected from the group consisting of $SiH_4$ and $Si_2H_6$;
   forming a second layer comprising silicon oxide on said first layer by plasma CVD using a second reactive gas comprising TEOS and nitrogen oxide.

25. A method of according to claim 24 wherein the CVD for forming the first layer is a photo CVD.

26. A method of according to claim 24 wherein said nitrogen oxide is $N_2O$.

27. A method for forming a device comprising steps of:
   forming a first layer comprising silicon nitride on a surface by CVD using a first reactive gas containing a gas selected from the group consisting of $SiH_4$ and $Si_2H_6$;
   forming a second layer comprising silicon oxide on said first layer by plasma CVD using a second reactive gas comprising TEOS and nitrogen oxide.

28. A method of according to claim 27 wherein the CVD for forming the first layer is a photo CVD.

29. A method of according to claim 27 wherein said nitrogen oxide is $N_2O$.

30. A method for forming a device comprising steps of:
   forming a first layer comprising silicon oxide on a surface by CVD using a first reactive gas containing a gas selected from the group consisting of $SiH_4$ and $Si_2H_6$;
   forming a second layer comprising silicon oxide on said first layer by plasma CVD using a second reactive gas comprising TEOS and oxygen.

31. A method of according to claim 30 wherein the CVD for forming the first layer is a photo CVD.

32. A method for forming a device comprising steps of:
   forming a first layer comprising silicon nitride on a surface by CVD using a first reactive gas containing a gas selected from the group consisting of $SiH_4$ and $Si_2H_6$;
   forming a second layer comprising silicon oxide on said first layer by plasma CVD using a second reactive gas comprising TEOS and oxygen.

33. A method of according to claim 32 wherein the CVD for forming the first layer is a photo CVD.

34. A method for forming a device comprising steps of:
forming a first layer comprising silicon oxide on a surface by CVD using a first reactive gas containing a gas selected from the group consisting of $SiH_4$ and $Si_2H_6$;
forming a second layer comprising silicon oxide on said first layer by plasma CVD using a second reactive gas comprising TEOS and nitrogen oxide, and
cleaning an inside of a reaction chamber in which said second layer has been formed.

35. A method of according to claim 34 wherein the cleaning step is carried out by using an etching gas comprising nitrogen fluoride.

36. A method of according to claim 34 wherein said nitrogen oxide is $N_2O$.

37. A method of according to claim 34 wherein the cleaning of said inside of said reaction chamber is conducted by removing said second layer therefrom in accordance with a reaction, $3SiO_2+4NF_3 \rightarrow 3SiF_4+2N_2+3O_2$.

38. A method of according to claim 34 wherein the CVD for forming the first layer is a photo CVD.

39. A method of according to claim 38 wherein the CVD for forming the first layer is a photo CVD.

40. A method of according to claim 38 wherein the cleaning step is carried out by using an etching gas comprising nitrogen fluoride.

41. A method of according to claim 38 wherein the cleaning of said inside of said reaction chamber is conducted by removing said second layer therefrom in accordance with a reaction, $3SiO_2+4NF_3 \rightarrow 3SiF_4+2N_2+3O_2$.

42. A method for forming a device comprising steps of:
forming a first layer comprising silicon oxide on a surface by CVD using a first reactive gas containing a gas selected from the group consisting of $SiH_4$ and $Si_2H_6$;
forming a second layer comprising silicon oxide on said first layer by plasma CVD using a second reactive gas comprising TEOS and oxygen, and
cleaning an inside of a reaction chamber in which said second layer has been formed.

43. A method for forming a device comprising steps of:
forming a first layer comprising silicon nitride on a surface by CVD using a first reactive gas containing a gas selected from the group consisting of $SiH_4$ and $Si_2H_6$;
forming a second layer comprising silicon oxide on said first layer by plasma CVD using a second reactive gas comprising TEOS and nitrogen oxide, and
cleaning an inside of a reaction chamber in which said second layer has been formed.

44. A method of according to claim 43 wherein the cleaning step is carried out by using an etching gas comprising nitrogen fluoride.

45. A method of according to claim 43 wherein said nitrogen oxide is $N_2O$.

46. A method of according to claim 43 wherein the cleaning of said inside of said reaction chamber is conducted by removing said second layer therefrom in accordance with a reaction, $3SiO_2+4NF_3 \rightarrow 3SiF_4+2N_2+3O_2$.

47. A method of according to claim 43 wherein the CVD for forming the first layer is a photo CVD.

48. A method for forming a device comprising steps of:
forming a first layer comprising silicon nitride on a surface by CVD using a first reactive gas containing a gas selected from the group consisting of $SiH_4$ and $Si_2H_6$;
forming a second layer comprising silicon oxide on said first layer by plasma CVD using a second reactive gas comprising TEOS and oxygen, and
cleaning an inside of a reaction chamber in which said second layer has been formed.

49. A method of according to claim 48 wherein the cleaning step is carried out by using an etching gas comprising nitrogen fluoride.

50. A method of according to claim 48 wherein said nitrogen oxide is $N_2O$.

51. A method of according to claim 48 wherein the cleaning of said inside of said reaction chamber is conducted by removing said second layer therefrom in accordance with a reaction, $3SiO_2+4NF_3 \rightarrow 3SiF_4+2N_2+3O_2$.

52. A method of according to claim 48 wherein the CVD for forming the first layer is a photo CVD.

* * * * *

(12) EX PARTE REEXAMINATION CERTIFICATE (5699th)
United States Patent
Inushima et al.

(10) Number: US 6,013,338 C1
(45) Certificate Issued: Mar. 13, 2007

(54) CVD APPARATUS

(75) Inventors: Takashi Inushima, Kanagawa (JP); Shigenori Hayashi, Kanagawa (JP); Toru Takayama, Kanagawa (JP); Masakazu Odaka, Akita (JP); Naoki Hirose, Yamaguchi (JP)

(73) Assignee: Semiconductor Energy Laboratory Co., Ltd., Atsugi (JP)

Reexamination Request:
No. 90/007,847, Dec. 15, 2005

Reexamination Certificate for:
Patent No.: 6,013,338
Issued: Jan. 11, 2000
Appl. No.: 09/188,382
Filed: Nov. 10, 1998

Related U.S. Application Data

(62) Division of application No. 08/769,115, filed on Dec. 18, 1996, now Pat. No. 5,855,970, which is a division of application No. 08/376,736, filed on Jan. 23, 1995, now Pat. No. 5,629,245, which is a division of application No. 07/971,242, filed on Sep. 8, 1992, now Pat. No. 5,427,824, which is a continuation of application No. 07/702,492, filed on May 20, 1991, now abandoned, which is a continuation-in-part of application No. 07/497,794, filed on Mar. 22, 1990, now abandoned, which is a continuation of application No. 07/091,770, filed on Sep. 1, 1987, now abandoned.

(30) Foreign Application Priority Data

| Sep. 9, 1986 | (JP) | 61-213323 |
| Sep. 9, 1986 | (JP) | 61-213324 |
| Sep. 9, 1986 | (JP) | 61-213325 |
| Jun. 5, 1987 | (JP) | 62-141050 |

(51) Int. Cl.
*H01L 21/20* (2006.01)
*H05H 1/24* (2006.01)

(52) U.S. Cl. .............. 427/579; 427/58; 427/255.7; 427/331; 427/344; 427/574; 427/581

(58) Field of Classification Search .............. None
See application file for complete search history.

(56) References Cited

U.S. PATENT DOCUMENTS

| 4,015,558 A | 4/1977 | Small et al. |
| 4,495,218 A | 1/1985 | Azuma et al. |
| 4,546,535 A | 10/1985 | Shepard |

(Continued)

FOREIGN PATENT DOCUMENTS

| JP | 52-075183 | 6/1977 |
| JP | 55-014138 | 4/1980 |
| JP | 58-93329 A | 6/1983 |
| JP | 58-197856 | 11/1983 |
| JP | 60-145628 | 8/1985 |
| JP | 61-110772 | 5/1986 |
| JP | 61-289649 | 12/1986 |
| JP | 62-045022 | 2/1987 |
| JP | 62-216318 | 9/1987 |
| JP | 63-000123 A2 | 1/1988 |
| JP | 63-314828 | 12/1988 |
| JP | 02-129371 | 5/1990 |

OTHER PUBLICATIONS

R. A. Levy et al., "A New LPCVD Technique of Producing Borophosphosilicate Glass Films by Injection of Miscible Liquid Precursor," J. Electrochem. Soc. (Journal of the Electrochemical Society), vol. 134, No. 2, pp. 430–436; Feb. 1, 1987.

(Continued)

*Primary Examiner*—Kiley Stoner

(57) ABSTRACT

An improved CVD apparatus for depositing a uniform film is shown. The apparatus comprises a reaction chamber, a substrate holder and a plurality of light sources for photo CVD or a pair of electrodes for plasma CVD. The substrate holder is a cylindrical cart which is encircled by the light sources, and which is rotated around its axis by a driving device. With this configuration, the substrates mounted on the cart and the surroundings can be energized by light of plasma evenly throughout the surfaces to be coated.

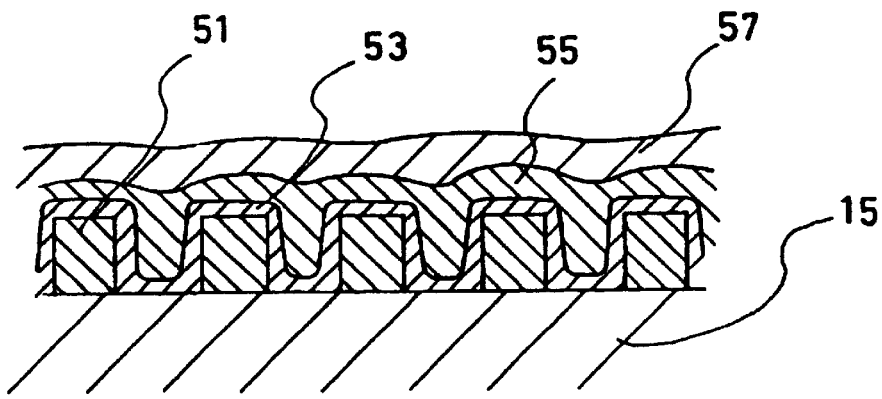

U.S. PATENT DOCUMENTS

| | | |
|---|---|---|
| 4,579,609 A | 4/1986 | Reif et al. |
| 4,597,986 A | 7/1986 | Scapple et al. |
| 4,601,260 A | 7/1986 | Ovshinsky |
| 4,634,496 A | 1/1987 | Mase et al. |
| 4,636,401 A | 1/1987 | Yamazaki et al. |
| 4,657,616 A | 4/1987 | Benzing et al. |
| 4,705,912 A | 11/1987 | Nakashima et al. |
| 4,848,272 A | 7/1989 | Ohmura et al. |
| 4,857,139 A | 8/1989 | Tashiro et al. |
| 4,894,352 A | 1/1990 | Lane et al. |
| 5,389,581 A | 2/1995 | Freiberger et al. |
| 5,650,013 A | 7/1997 | Yamazaki |

OTHER PUBLICATIONS

F. S. Becker et al., "Process and film characterization of low pressure tetraethylorthosilicate–borophosphosilicate glass," J. Vac. Sci. Technol. B. (Journal of Vacuum Science & Technology B), vol. 4, No. 3, pp. 732–744, May 1, 1986.

K. I. Kirov et al., "Investigation of silicon dioxide layers deposited by plasma decomposition of tetra–ethoxy silane in a planar reactor," Phys. Stat. Sol. (A) (Physica Status Solidi. A. Applied Research), vol. 48, No. 2, Abstract only, Jan. 1, 1978.

U. Mackens et al., "Plasma–Enhanced Chemically Vapour–Deposited Silicon Dioxide for Metal/Oxide/Semiconductor Structures on InSb, Thin Solid Films," vol. 97, No. 1, Abstract only, Nov. 5, 1982.

K. Tsuneto et al., "Reactive ion etching for silicon and silicon dioxide with nitrogen fluoride," Sci. Eng. Rev. (Science and Engineering Review of Doshisha University), vol. 24, No. 4, Abstract only, Jan. 1, 1984.

M. J. Thoma et al., "A 1.0 µm CMOS Two Level Metal Technology Incorporating Plasma Enhanced TEOS," V–MIC Conf., Jun. 15–16, 1987, pp. 20–26.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–52 is confirmed.

* * * * *